United States Patent
Bayerer

(10) Patent No.: US 10,312,167 B2
(45) Date of Patent: Jun. 4, 2019

(54) SEMICONDUCTOR PACKAGE, ASSEMBLY AND MODULE ARRANGEMENTS FOR MEASURING GATE-TO-EMITTER/SOURCE VOLTAGE

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/433,706

(22) Filed: Feb. 15, 2017

(65) Prior Publication Data

US 2018/0233421 A1    Aug. 16, 2018

(51) Int. Cl.
| | |
|---|---|
| H01L 23/58 | (2006.01) |
| H01L 29/10 | (2006.01) |
| H01L 21/66 | (2006.01) |
| H01L 23/31 | (2006.01) |
| H01L 49/02 | (2006.01) |
| H01L 23/00 | (2006.01) |
| H01L 23/495 | (2006.01) |
| H01L 23/498 | (2006.01) |
| H01L 23/66 | (2006.01) |

(52) U.S. Cl.
CPC .......... H01L 22/32 (2013.01); H01L 23/3114 (2013.01); H01L 23/49562 (2013.01); H01L 23/49844 (2013.01); H01L 23/66 (2013.01); H01L 24/48 (2013.01); H01L 28/20 (2013.01); *H01L 2223/6627* (2013.01)

(58) Field of Classification Search
CPC ............... H01L 22/32; H01L 23/49562; H01L 23/49844; H01L 24/48; H01L 23/66; H01L 28/20; H01L 23/3114; H01L 2223/6627
See application file for complete search history.

(56) References Cited

U.S. PATENT DOCUMENTS

| | | | |
|---|---|---|---|
| 7,791,208 B2 | 9/2010 | Bayerer | |
| 8,487,407 B2 | 7/2013 | Bayerer et al. | |
| 8,773,172 B2 | 7/2014 | Bayerer | |
| 9,355,950 B1 | 5/2016 | Bayerer | |
| 2007/0181934 A1* | 8/2007 | Hu | H01L 23/49541 257/315 |
| 2011/0216561 A1 | 9/2011 | Bayerer et al. | |
| 2012/0001308 A1* | 1/2012 | Fukutani | H01L 23/49524 257/675 |
| 2013/0049079 A1* | 2/2013 | Munoz | H01L 24/49 257/288 |
| 2013/0187627 A1* | 7/2013 | Imada | H01L 27/088 323/311 |
| 2016/0029478 A1 | 1/2016 | Bayerer | |
| 2016/0056132 A1 | 2/2016 | Bayerer et al. | |
| 2016/0219705 A1 | 7/2016 | Bayerer | |
| 2018/0166430 A1* | 6/2018 | Akiyama | H01L 21/8213 |

OTHER PUBLICATIONS

National Semiconductor Datasheet, LM386, Aug. 2000, pp. 1-10.*

* cited by examiner

Primary Examiner — Ismail A Muse
(74) Attorney, Agent, or Firm — Murphy, Bilak & Homiller, PLLC

(57) ABSTRACT

One or more additional sense terminals are added to discrete semiconductor packages, assemblies and semiconductor modules, including power semiconductor modules, to sense accurately the voltage between the gate and emitter/source of voltage-controlled chips, inside the package, assembly or module.

5 Claims, 13 Drawing Sheets

SEMICONDUCTOR PACKAGE, ASSEMBLY AND MODULE ARRANGEMENTS FOR MEASURING GATE-TO-EMITTER/SOURCE VOLTAGE

TECHNICAL FIELD

The present application relates to semiconductor packages, assemblies and modules, in particular measuring gate-to-emitter/source voltage in semiconductor packages, assemblies and modules.

BACKGROUND

Voltage-controlled power semiconductors are used in many types of power electronic circuits, such as buck and boost converters, inverter circuits for motor drives, half bridge and full bridge circuits, resonant circuits, etc. In some cases, e.g. short circuit detection by gate charge or by measuring the simultaneous behaviour of di/dt and the gate voltage of the power semiconductor, the actual gate voltage of the power semiconductor must be measured accurately. However, parasitic inductance and gate resistance prevents accurate measurement as the gate voltage measured between the gate and emitter/source terminals of a power semiconductor package, assembly or module includes voltage drop from the parasitic components. Yet, some parasitic inductance in the emitter/source is intended to be part of the gate circuit for limiting di/dt. Gate resistors are also integrated within packages or chips to dampen internal oscillations within the power circuits or gate circuits.

In some conventional approaches for measuring the actual gate voltage of the power semiconductor, gate voltage measurements taken during the time in which a voltage drop from parasitic components exists are not used for detection. Instead, this time is blanked out and no decision on a fault occurs, which would need to be measured through the gate voltage. In other conventional approaches for measuring the actual gate voltage of the power semiconductor, the gate circuit and the power circuit are designed to be nearly free of parasitic inductance and no gate resistors are integrated inside the package which may not be ideal or even feasible in many cases. Semiconductor packages, assemblies and modules with more robust provisions for measuring gate voltage are desired.

SUMMARY

According to an embodiment of a semiconductor package, the semiconductor package comprises a single controllable power semiconductor die embedded in a molding compound. The power semiconductor die comprises a gate pad, an emitter/source pad and a collector/drain pad. The semiconductor package further comprises a first terminal protruding from the molding compound and electrically connected to the gate pad of the power semiconductor die, a second terminal protruding from the molding compound and electrically connected to the gate pad or an additional gate pad of the power semiconductor die, a third terminal protruding from the molding compound and electrically connected to the collector/drain pad of the power semiconductor die, a fourth terminal protruding from the molding compound and electrically connected to the emitter/source pad of the power semiconductor die, and a fifth terminal protruding from the molding compound and electrically connected to the emitter/source pad of the power semiconductor die. The second terminal and the fourth terminal are configured to carry just a current which is necessary to sense a gate-to-emitter/source voltage of the power semiconductor die.

According to an embodiment of a semiconductor assembly, the semiconductor assembly comprises a substrate and a semiconductor package attached to the substrate. The substrate comprises a plurality of electrically conductive traces, The semiconductor package comprises a single controllable power semiconductor die embedded in a molding compound, a first terminal protruding from the molding compound and electrically connected to a gate pad of the power semiconductor die, a second terminal protruding from the molding compound and electrically connected to a collector/drain pad of the power semiconductor die, a third terminal protruding from the molding compound and electrically connected to an emitter/source pad of the power semiconductor die, and a fourth terminal protruding from the molding compound and electrically connected to the emitter/source pad of the power semiconductor die. A first one of the metal traces of the substrate is connected to the first terminal of the semiconductor package. The first metal trace and the third terminal are configured to carry just a current which is necessary to sense a gate-to-emitter/source voltage of the power semiconductor die.

According to an embodiment of a semiconductor module, the semiconductor module comprises a substrate and a power semiconductor die attached to the substrate. The substrate comprises a plurality of electrically conductive regions isolated from one another. The power semiconductor die comprises a gate pad electrically connected to a first one of the electrically conductive regions, an emitter/source pad electrically connected to a second one of the electrically conductive regions and a collector/drain pad electrically connected to a third one of the electrically conductive regions. The semiconductor module further comprises a first terminal is attached to the first electrically conductive region of the substrate, a second terminal electrically connected to the gate pad or an additional gate pad of the power semiconductor die, a third terminal attached to the second electrically conductive region of the substrate, a fourth terminal electrically connected to the emitter/source pad of the power semiconductor die, and a fifth terminal attached to the third electrically conductive region of the substrate. The second terminal and the fourth terminal are configured to carry just a current which is necessary to sense a gate-to-emitter/source voltage of the power semiconductor die.

According to an embodiment of a power semiconductor module, the power semiconductor module comprises a substrate, a first group of power semiconductor dies attached to the substrate and evenly distributed over a width of the substrate, and a connection structure disposed over the substrate and the first group of semiconductor dies. The substrate comprises a plurality of metal layers separated from one another by insulating layers. Each power semiconductor die included in the first group comprises a gate pad, an emitter/source pad and a collector/drain pad. The connection structure comprises a plurality of first conductor sections electrically connected to the gate pads of the power semiconductor dies included in the first group and a plurality of second conductor sections electrically connected to the emitter/source pads of the power semiconductor dies included in the first group. The power semiconductor module further comprises a first terminal attached to a first one of the first conductor sections of the connection structure, a second terminal electrically connected to the gate pad or an additional gate pad of at least one of the power semiconductor dies included in the first group, a third terminal attached to a first one of the second conductor sections of the connection structure, and a fourth terminal electrically connected to the emitter/source pad of at least one of the power semiconductor dies included in the first group. The second terminal and the fourth terminal are configured to carry just a current which is necessary to sense a gate-to-emitter/source voltage of at least one of the power semiconductor dies included in the first group. A parallel plate waveguide is formed by two of the metal layers of the substrate, or by the first and the second conductor sections of the connection structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein connect the gate circuit of a voltage-controlled power semiconductor transistor to the emitter/source of the transistor in a way that allows for some parasitic inductance that is common for the power and gate circuits, thus damping di/dt during switching, or the gate circuit includes parasitic inductance of which a significant part is inside the package. The gate circuit may include one or more gate resistors within the gate path, within the auxiliary emitter path or at both paths within the package. At least one additional sense terminal is added to the package, assembly or module that includes the voltage-controlled power semiconductor transistor, to accurately sense the voltage between the gate and emitter/source of the voltage-controlled semiconductor, inside the package e.g. to provide for short circuit detection by gate charge or by measuring the simultaneous behaviour of di/dt and the gate voltage of the power semiconductor. The term "emitter/source" as used herein is intended to describe the emitter of an IGBT (insulated gate power transistor) or the source of a MOSFET (metal-oxide semiconductor field-effect transistor), HEMT (high electron mobility transistor), etc. Likewise, the term "collector/drain" as used herein is intended to describe the collector of an IGBT or the drain of a FET, HEMT, etc.

Figure 1:
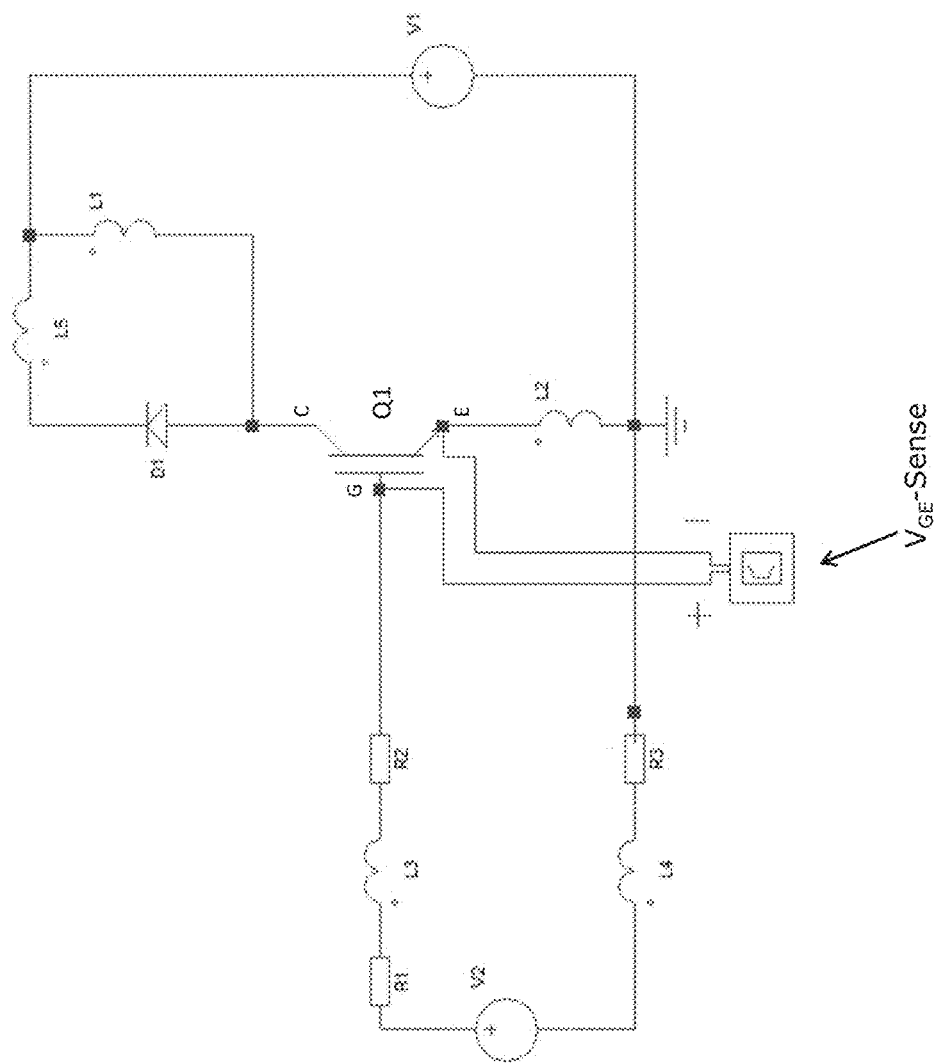
FIGS. 1 and 2 illustrate respective schematics of an IGBT having a power circuit and a gate circuit.

FIG. 1 illustrates a schematic of an IGBT (Q1) having a power circuit represented by voltage source V1 connected between the collector (C) and emitter (E) of the IGBT, and a gate circuit represented by voltage source V2 connected between the gate (G) and emitter E of the IGBT. L2 represents the parasitic inductance at the emitter E. L3 and L4 represent the parasitic inductance in the gate circuit, where L3 is part of the gate path and L4 is part of an auxiliary emitter path used for driving the gate. R1 and R2 are resistors in the gate path, R3 is a resistor in the auxiliary emitter path, and D1 is a diode in the power circuit.

The IGBT is only schematically illustrated in FIG. 1, but in practice would be provided as a semiconductor transistor die included in a package, assembly or module. In the case of a packaged IGBT die, part of L3 and part of L4 are inside the package. R2 may be integrated into the IGBT die (chip). R3 may be integrated into the package or placed on a driver board which includes logic for driving the IGBT. Gate resistor R1 is used to adjust switching speed of the IGBT, and is external to the package, e.g. on the driver board. The package also includes terminals (not shown in FIG. 1) for making electrical connection to the IGBT.

As used herein, the term "terminal" refers to the point at which a conductor from a semiconductor package, assembly or module comes to an end and provides a point of connection to external circuits. For a semiconductor package, assembly or module that includes the IGBT shown in FIG. 1, the package, assembly or module includes at least a gate terminal, a collector terminal, an emitter terminal and an auxiliary emitter terminal. The semiconductor package, assembly or module also includes one or more additional sense terminals for accurately sensing the voltage between the gate and emitter/source of the IGBT. Any type of standard terminal can be used in the embodiments described herein, such as pins, columns, solder balls, solder bumps, leads of a lead frame, etc. The terminals can be straight, rounded, stepped, bent, shaped by stamping, etc. In each case, an external voltage sense circuit e.g. as shown in FIG. 1 is provided for sensing the voltage between the gate and emitter/source of the IGBT, based on the voltage at the sense terminals of the semiconductor package, assembly or module electrically connected to the voltage sense circuit.

Figure 2:
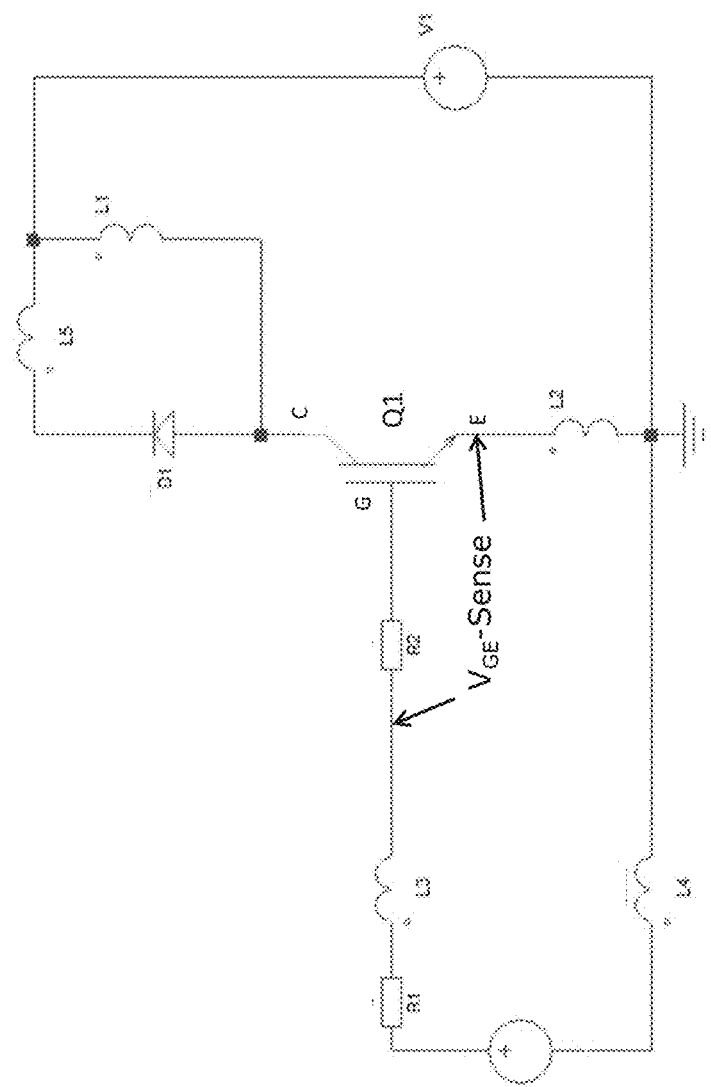

Ideally, the voltage between the gate and emitter of the IGBT ($V_{GE}$-Sense) is sensed as closely as possible to the gate and emitter of the IGBT. In the case of R2 being external to the package that includes the IGBT, or integrated within the package and larger than 25% of the total gate resistance, the gate voltage is sensed between R2 and the gate of the IGBT as shown in FIG. 1. In the case of R2 being integrated within the package that includes the IGBT and less than 25% of the total gate resistance, the gate voltage can be sensed behind R2 as shown in FIG. 2.

Described next are various embodiments of semiconductor package, assembly and module arrangements for implementing gate to emitter/source voltage sensing in voltage-controlled power semiconductor transistors.

Discrete Semiconductor Packages

Figure 3:
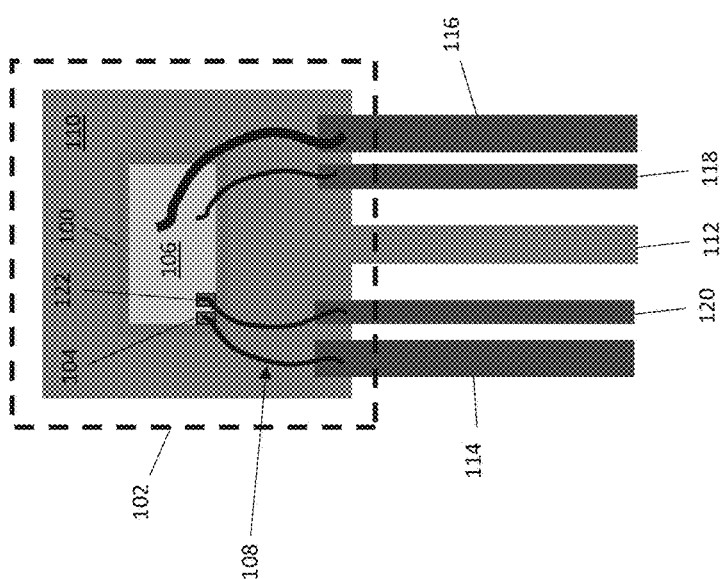

FIG. 3 illustrates an embodiment of a discrete semiconductor package that includes a single controllable power semiconductor die 100 such as an IGBT, MOSFET or HEMT die embedded in a molding compound 102 (there may be another semiconductor, a diode, within the same package). The power semiconductor die 100 has a main gate pad 104, a main emitter/source pad 106 and a main collector/drain pad (out of view on bottom side of die 100) for making the necessary electrical connections to the die 100. The molding compound 102 is illustrated as a dashed box in FIG. 3, so that the die pads 104, 106 and electrical connections 108 to the die pads 104, 106 are visible. Any standard molding compound can be used such as elastomers, composite compounds, thermoplastics, thermosets or thermosetting plastics, silicone, etc.

In one case, the power semiconductor die 100 is a vertical device in that the main current path is between the top and bottom surfaces of the die 100. In this case, the collector/ drain pad may be disposed at the bottom surface of die 100 and attached to a metal plate 110 such as a die pad of a lead frame. A collector/drain terminal 112 of the discrete semiconductor package protrudes from the molding compound 102 and is electrically connected to the collector/drain pad of the power semiconductor die 100. The main gate pad 104 and main emitter/source pad 106 are disposed at the opposite (top) surface of the die 100 as the collector/drain pad.

A main gate terminal 114 of the discrete semiconductor package protrudes from the molding compound 102 and is electrically connected to the main gate pad 104 of the power semiconductor die 100. A main emitter/source terminal 116 of the discrete semiconductor package protrudes from the molding compound 102 and is electrically connected to the main emitter/source pad 106 of the power semiconductor die 100. An emitter/source sense terminal 118 of the discrete semiconductor package protrudes from the molding compound 102 and also is electrically connected to the main emitter/source pad 196 of the power semiconductor die 100. The emitter/source sense terminal 118 can be a standard auxiliary emitter/source terminal which forms part of the gate circuit loop.

Two terminals are needed to drive current in and out of the gate circuit loop. One terminal is the main gate terminal 114. The other terminal is an auxiliary emitter/source terminal. Instead of a standard auxiliary emitter/source terminal, an additional emitter/source sense terminal can be added to the package for sensing the gate-to-emitter/source voltage of the power semiconductor die. Electrical connections 108 between the package terminals 112-120 and corresponding pads 104, 106, 122 of the power semiconductor die 100 can be implemented using any standard terminal-to-die pad interconnects such as bond wires, ribbons, metal clips, etc.

Instead of a vertical transistor device, the power semiconductor die 100 may include a lateral transistor device in which the main current path is along the top surface of the die 100. In the case of a lateral transistor device, the collector/drain pad is at the same (top) surface of the die 100 as the other pads 104, 106, 122 and the collector/drain terminal 112 is electrically connected to the collector/drain pad at the top surface of the power semiconductor die 100 instead of the metal plate.

Regardless of the device type (vertical or lateral), the discrete semiconductor package further includes a gate sense terminal 120 protruding from the molding compound 102 and electrically connected to an additional gate pad 122 of the power semiconductor die 100. The gate sense terminal 120 and the emitter/source sense terminal 118 are configured to carry just a current which is necessary to sense a gate-to-emitter/source voltage of the power transistor included in the semiconductor die 100. In other words, the gate sense terminal 120 and the emitter/source sense terminal 118 of the discrete semiconductor package do not carry current for charging or discharging the gate capacitance of the power transistor included in the die 100. Instead, the gate sense terminal 120 and the emitter/source sense terminal 112 of the discrete semiconductor package carry only a negligible amount of current which is needed to measure the gate-to-emitter/source voltage.

According to the embodiment illustrated in FIG. 3, the power semiconductor die 100 comprises an integrated gate resistor (out of view in FIG. 3) in series with the gate of the power transistor included in the die 100, and the integrated resistor is larger than 25% of the total gate resistance. The additional gate pad 122, to which the gate sense terminal 120 of the discrete semiconductor package is connected, is electrically connected to a node between the gate of the power transistor and the integrated gate resistor e.g. as shown in FIG. 1. With this configuration, the integrated resistor has no effect on the gate to emitter/source voltage sensing.

Figure 4:
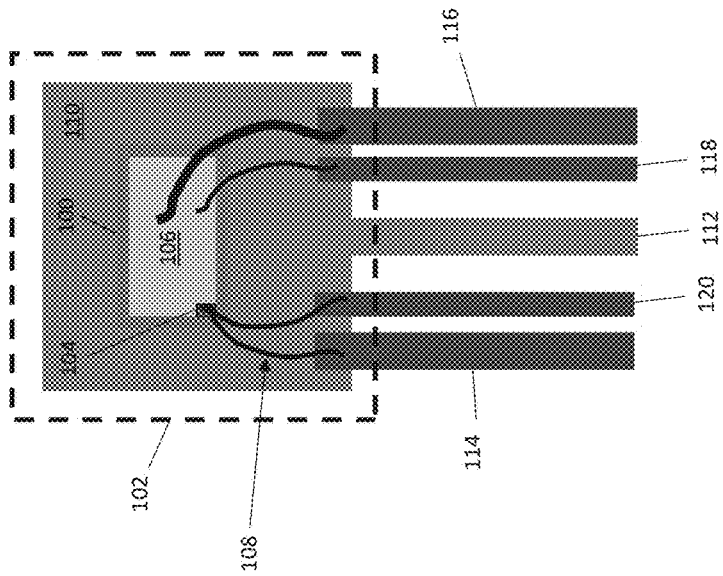
FIGS. 3 and 4 illustrate respective schematics of a discrete semiconductor package.

FIG. 4 illustrates another embodiment of a discrete semiconductor package that includes a single controllable power semiconductor die such as an IGBT, MOSFET or HEMT die embedded in a molding compound (there may be another semiconductor, a diode, within the same package). The discrete semiconductor package embodiment shown in FIG. 4 is similar to the embodiment shown in FIG. 3. Different, however, the power semiconductor die 100 does not include an integrated gate resistor in series with the gate of the power transistor included in the die 100, or if an integrated gate resistor is included in the die 100, the resistor is less than 25% of the total gate resistance. In either case, the gate sense terminal of the discrete semiconductor package is electrically connected to the same main gate pad 104 of the power semiconductor die 100 as the main gate terminal 114 of the package. If the power semiconductor die 100 includes an integrated gate resistor in series with the gate of the power transistor, the gate voltage is sensed behind the integrated gate resistor according to this embodiment e.g. as shown in FIG. 2.

Semiconductor Board Assemblies

Figure 5:
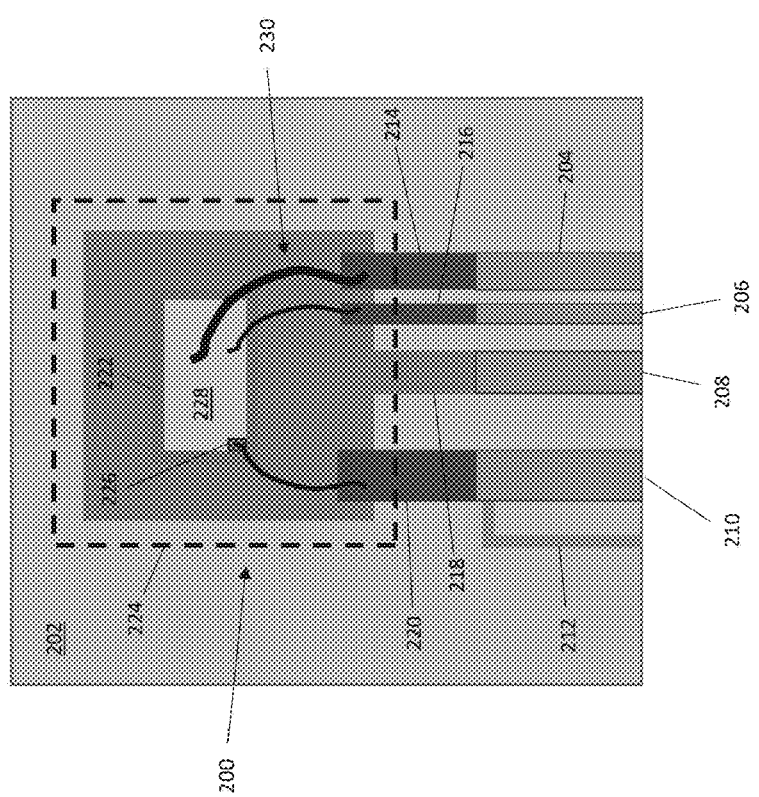

FIG. 5 illustrates a partial view of an embodiment of a semiconductor board assembly that includes one or more discrete semiconductor packages 200 attached to a substrate 202. The substrate 202 has a plurality of electrically conductive traces 204-212 to which corresponding terminals 214-220 of the package 200 are electrically connected. In one embodiment, the substrate 202 is a printed circuit board (PCB) and the electrically conductive traces 204-212 are conductive tracks etched from copper sheets laminated onto a non-conductive substrate. In another embodiment, the substrate 202 is a power electronic substrate such as a DCB (direct bonded copper) substrate, AMB (active metal brazed) substrate, DAB (direct aluminum bonded) substrate, etc. having a ceramic body with a metallized side patterned to form the electrically conductive traces 204-212. Each discrete semiconductor package 200 attached to the substrate 202 includes a single controllable power semiconductor die 222 (there may be another semiconductor, a diode, within the same package). For ease of illustration only, one discrete semiconductor package is shown in FIG. 5. Attachment of the package 200 to the substrate 202 is schematically illustrated for ease of illustration. In practice, any standard package attachment technology can be employed such as surface mount, through-hole, etc.

The discrete semiconductor package 200 includes a single controllable power semiconductor die 222 such as an IGBT, MOSFET, HEMT, etc. embedded in a standard molding compound 224. The semiconductor package 200 further includes a main gate terminal 220 protruding from the molding compound 224 and electrically connected to a main gate pad 226 of the power semiconductor die 222, a collector/drain terminal 218 protruding from the molding compound 224 and electrically connected to a collector/drain pad (out of view in FIG. 5) of the power semiconductor die 222, a main emitter/source terminal 214 protruding from the molding compound 224 and electrically connected to a main emitter/source pad 228 of the power semiconductor die 222, and an emitter/source sense terminal 216 such as an auxiliary emitter/source terminal protruding from the molding compound 224 and electrically connected to the main emitter/source pad 228 of the power semiconductor die 222. The molding compound 224 of the semiconductor package 200 is illustrated as a dashed box in FIG. 5, so that the die pads 226, 228 and electrical connections 230 to the die pads 226, 228 are visible. Electrical connections 230 between the package terminals 214-220 and corresponding pads 226, 228 of the power semiconductor die 222 can be implemented using any standard terminal-to-die pad interconnects such as bond wires, ribbons, metal clips, etc.

A first metal trace 210 of the substrate 202 is connected to the main gate terminal 220 of the semiconductor package 200. A second metal trace 208 of the substrate 202 is connected to the collector/drain terminal 218 of the semiconductor package 200. A third metal trace 204 of the substrate 202 is connected to the main emitter/source terminal 214 of the semiconductor package 200. A fourth metal trace 206 of the substrate 202 is connected to the emitter/source sense terminal 216 of the semiconductor package 200. A fifth metal trace 212 of the substrate 202 is connected to the first metal trace 210 of the substrate 202, separately branching off from the first trace 210. The gate-to-emitter/source voltage of the power semiconductor die included in the package 200 is measured at the fourth and fifth metal traces 206, 212 of the substrate 202. Accordingly, the fourth and fifth metal traces 206, 212 of the substrate 202 are configured to carry just a current which is necessary to sense the gate-to-emitter/source voltage of the power transistor in the semiconductor die 222. In other words, the fourth and fifth metal traces 206, 212 of the substrate 202 do not carry current for charging or discharging the gate capacitance of the power transistor included in the packaged die 222. Instead, the fourth and fifth metal traces 206, 212 of the substrate 202 carry only a negligible amount of current which is needed to measure the gate-to-emitter/source voltage.

Figure 6:
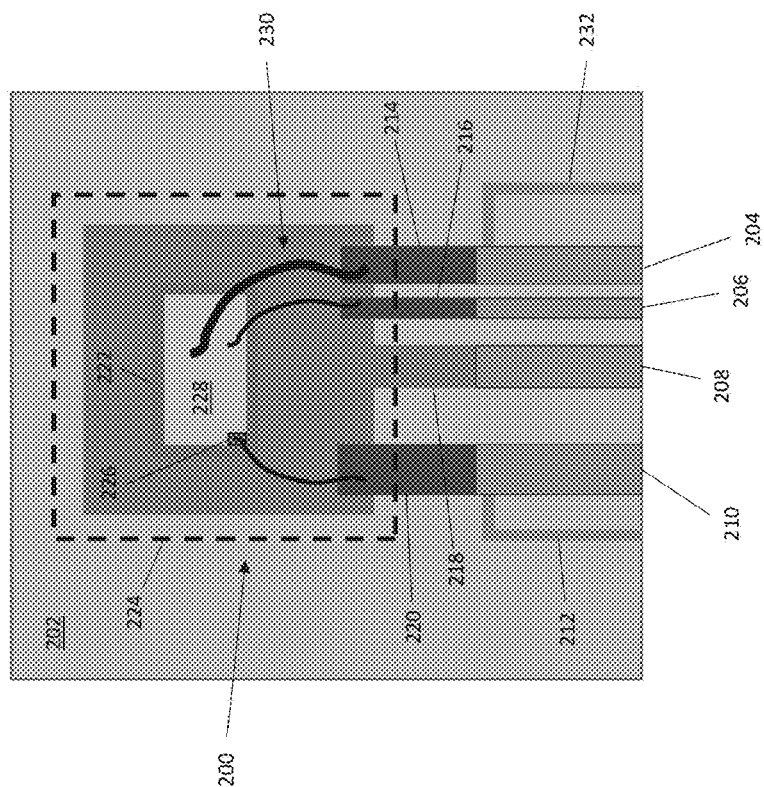
FIGS. 5 and 6 illustrate respective schematics of a semiconductor board assembly.

FIG. 6 illustrates a partial view of another embodiment of a semiconductor board assembly that includes one or more discrete semiconductor packages attached to a substrate. The discrete semiconductor package embodiment shown in FIG. 4 is similar to the embodiment shown in FIG. 3. Different, however, a sixth metal trace 232 of the substrate 202 is connected to the main emitter/source terminal 214 of the semiconductor package 200. According to this embodiment, the emitter/source sense terminal 216 of the semiconductor package 200 is not a standard auxiliary emitter/source terminal but instead is used only for gate-to-emitter/source voltage sensing and therefore does not serve a dual purpose. The sixth metal trace 232 of the substrate 202 is configured to provide the auxiliary emitter/source control connection to the power semiconductor die 222 included in the package 200 attached to the substrate 202.

Semiconductor Modules

Figure 7:
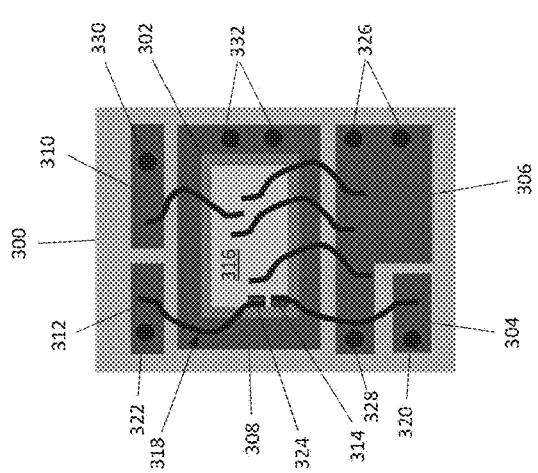

FIG. 7 illustrates a first embodiment of a semiconductor module that includes a substrate 300 and a power semiconductor die 302 attached to the substrate 300. The substrate 300 has a plurality of electrically conductive regions 304-312 isolated from one another. For example, the substrate 300 can be a lead frame, a PCB having conductive tracks etched from copper sheets laminated onto a non-conductive substrate, a power electronic substrate such as a DCB, AMB or DAB substrate having a ceramic body with a metallized side patterned to form the electrically conductive traces 304-312, etc.

In each case, the power semiconductor die 302 attached to the substrate 300 has a main gate pad 314 electrically connected to a first electrically conductive region 304 of the substrate 300, a main emitter/source pad 316 electrically connected to a second electrically conductive region 306 of the substrate 300 and a collector/drain pad (out of view in FIG. 7) electrically connected to a third electrically conductive region 308 of the substrate 300. The main emitter/source pad 316 of the die 302 is also electrically connected to a fourth electrically conductive region 310 of the substrate 300. Electrical connections 318 between the electrically conductive regions 304-312 of the substrate 300 and corresponding pads 314, 316 of the power semiconductor die 302 can be implemented using any standard terminal-to-die pad interconnects such as bond wires, ribbons, metal clips, etc. In the case of a vertical power semiconductor die, the collector/drain pad is disposed at the bottom surface of die 302. In the case of a lateral power semiconductor die, the collector/drain pad is at the same (top) surface of the die 302 as the other pads 314, 316.

In either case, the semiconductor module further includes a main gate terminal 320 attached to the first electrically conductive region 304 of the substrate 300, a gate sense terminal 322 attached to a fifth electrically conductive region 312 of the substrate 300 and electrically connected to an additional gate pad 324 of the power semiconductor die 302 e.g. through bond wires, ribbons, metal clips, etc., one or more main emitter/source terminals 326 attached to the second electrically conductive region 306 of the substrate 300, an auxiliary emitter/source terminal 328 attached to the second electrically conductive region 306 of the substrate 300, an emitter/source sense terminal 330 attached to the fourth electrically conductive region 310 of the substrate 300 and electrically connected to the main emitter/source pad 316 of the power semiconductor die 302 e.g. through bond wires, ribbons, metal clips, etc., and one or more collector/drain terminals 332 attached to the third electrically conductive region 308 of the substrate 300. The gate sense terminal 322 and the emitter/source sense terminal 330 of the module are configured to carry just a current which is necessary to sense a gate-to-emitter/source voltage of the power transistor included in the semiconductor die 302. In other words, the gate sense terminal 322 and the emitter/source sense terminal 330 of the module do not carry current for charging or discharging the gate capacitance of the power transistor included in the die 302. Instead, the gate sense terminal 322 and the emitter/source sense terminal 330 of the module carry only a negligible amount of current which is needed to measure the gate-to-emitter/source voltage.

According to the embodiment illustrated in FIG. 7, the main gate terminal 320 and the gate sense terminal 322 of the semiconductor module are attached to different electrically conductive regions 304, 312 of the substrate 300. Further according to the embodiment illustrated in FIG. 7, the power semiconductor die 302 comprises an integrated gate resistor (out of view in FIG. 7) in series with the gate of the power transistor included in the die 302 and the integrated gate resistor is greater than 25% of the total gate resistance of the power semiconductor die 302. The gate sense terminal 322 of the semiconductor module is electrically connected to the additional gate pad 324 of the power semiconductor die 302, and the additional gate pad 324 is electrically connected to a node between the gate of the power transistor and the integrated gate resistor e.g. as schematically illustrated in FIG. 1.

Figure 8:
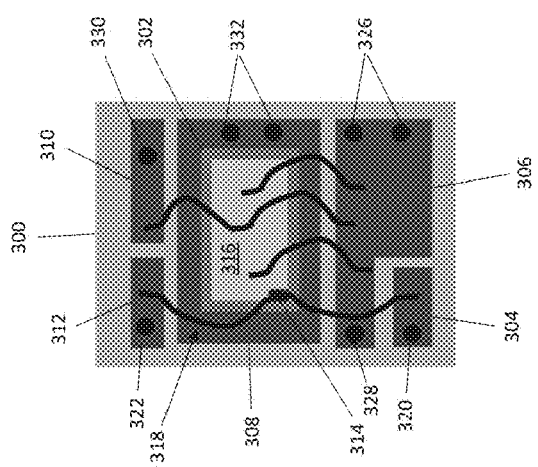

FIG. 8 illustrates a second embodiment of a semiconductor module that includes a substrate 300 and a power semiconductor die 302 attached to the substrate 300. The semiconductor module embodiment shown in FIG. 8 is similar to the embodiment shown in FIG. 7. Different, however, the integrated gate resistor is less than 25% of the total gate resistance of the power semiconductor die 302.

According to this embodiment, the gate sense terminal 322 of the semiconductor module is electrically connected to the same main gate pad 314 of the power semiconductor die 302 as the main gate terminal 320 of the module, and the integrated gate resistor is electrically connected in series between the main gate pad 314 and the gate of the power transistor included in the die 302 e.g. as schematically illustrated in FIG. 1.

Figure 9:
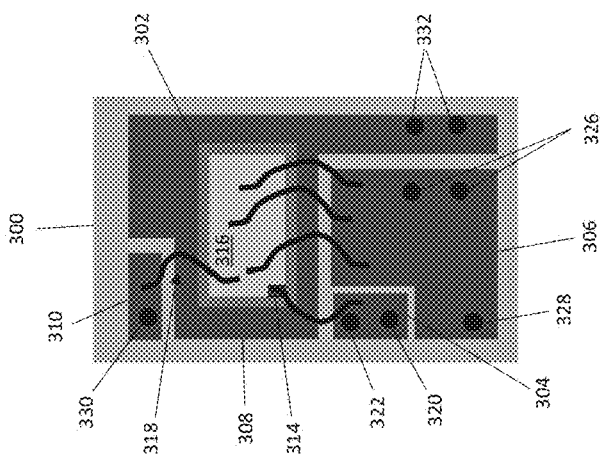
FIGS. 7 through 17 illustrate respective schematics of a semiconductor module.

FIG. 9 illustrates a third embodiment of a semiconductor module that includes a substrate 300 and a power semiconductor die 302 attached to the substrate 300. The semiconductor module embodiment shown in FIG. 9 is similar to the embodiment shown in FIG. 8. Different, however, the gate sense terminal 322 and the main gate terminal 320 of the semiconductor module are attached to the same electrically conductive region 304 of the substrate 300.

Figure 10:
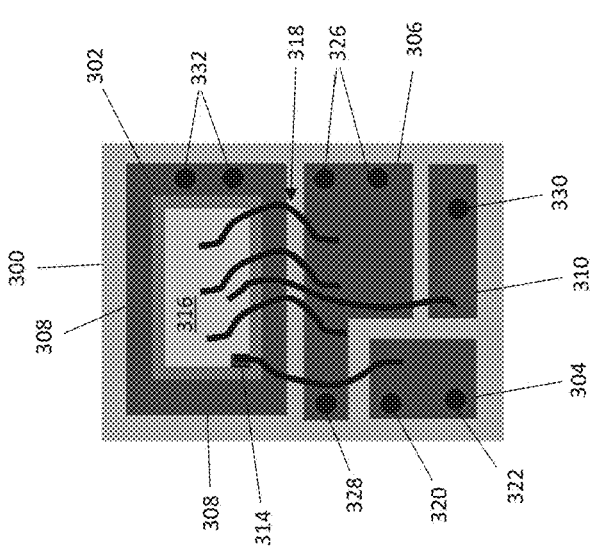

FIG. 10 illustrates a fourth embodiment of a semiconductor module that includes a substrate 300 and a power semiconductor die 302 attached to the substrate 300. The semiconductor module embodiment shown in FIG. 10 is similar to the embodiment shown in FIG. 9. Different, however, the electrically conductive region 306 of the substrate 300 to which the main emitter terminals 326 of the module are attached is interposed between the electrically conductive region 310 of the substrate to which the emitter/source sense terminal 330 of the module is attached and the electrically conductive region 308 of the substrate to which the collector/drain terminals 332 of the module are attached.

Figure 11:
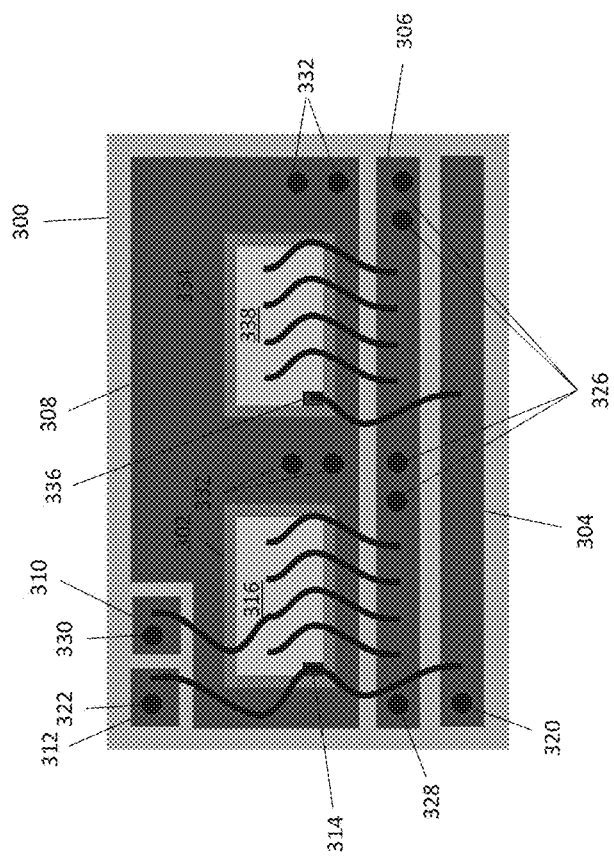

FIG. 11 illustrates a fifth embodiment of a semiconductor module that includes a substrate 300 and a power semiconductor die 302 attached to the substrate 300. The semiconductor module embodiment shown in FIG. 11 is similar to the embodiments shown in FIGS. 7 and 8. Different, however, an additional power semiconductor die 334 is attached to the substrate 300. The additional power semiconductor die 334 has a main gate pad 336 electrically connected to the same electrically conductive region 304 of the substrate 300 as the main gate pad 314 of the first power semiconductor die 302, a main emitter/source pad 338 electrically connected to the same electrically conductive region 306 of the substrate 300 as the main emitter/source pad 316 of the first die 302, and a collector/drain pad (out of view in FIG. 11) electrically connected to the same electrically conductive region 308 of the substrate 300 as the collector/drain pad of the first die 302. Further according to this embodiment, the main emitter/source terminals 326 and the emitter/source sense terminal 330 of the semiconductor module are attached to electrically conductive regions 308, 310 of the substrate 300 disposed at opposite sides of the electrically conductive region 308 of the substrate 300 to which the main collector/drain terminals 332 of the module are attached.

Figure 12:
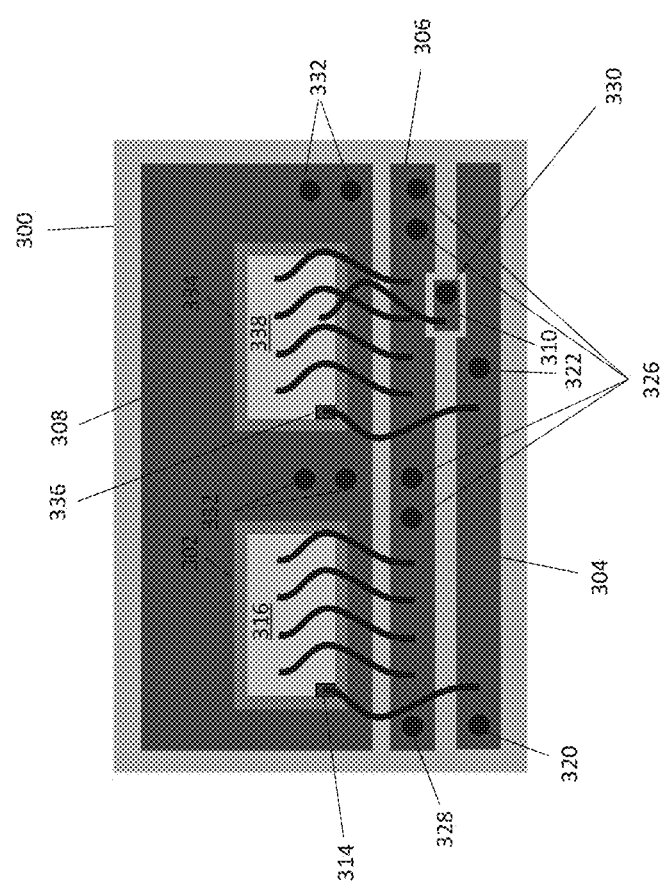

FIG. 12 illustrates a sixth embodiment of a semiconductor module that includes a substrate 300 and a power semiconductor die 302 attached to the substrate 300. The semiconductor module embodiment shown in FIG. 12 is similar to the embodiment shown in FIG. 11. Different, however, the main gate terminal 320 and the gate sense terminal 322 of the semiconductor module are attached to the same electrically conductive region 304 of the substrate 300. Also, the electrically conductive region 310 of the substrate 300 to which the emitter/source sense terminal 330 is attached is interposed between the electrically conductive region 304 of the substrate 300 to which the main gate and gate sense terminals 320, 322 are attached and the electrically conductive region 306 of the substrate 300 to which the main emitter/source terminals 326 are attached.

Figure 13:
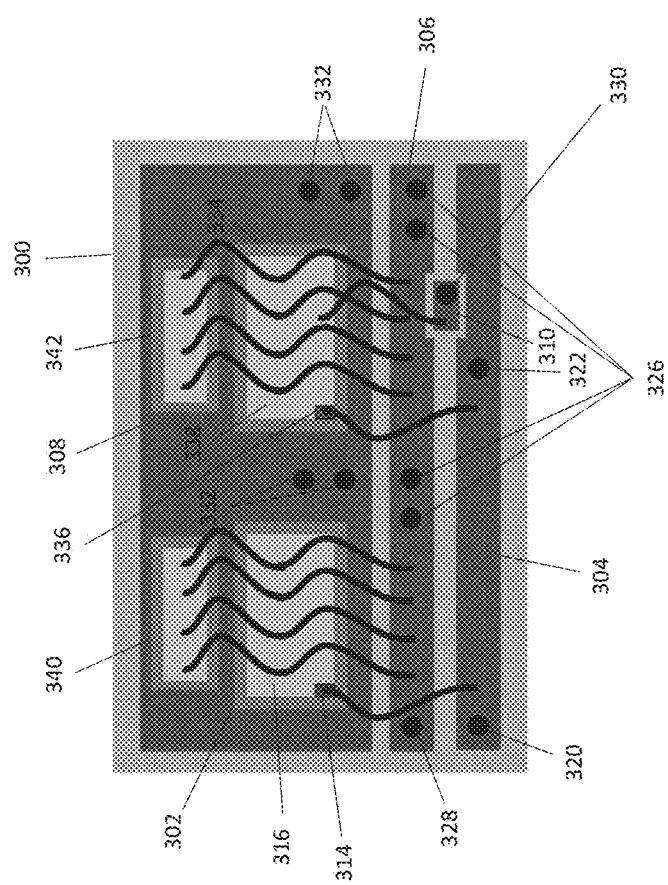

FIG. 13 illustrates a seventh embodiment of a semiconductor module that includes a substrate 300 and a power semiconductor die 302 attached to the substrate 300. The semiconductor module embodiment shown in FIG. 13 is similar to the embodiment shown in FIG. 12. Different, however, discrete freewheeling diodes 340, 342 are included in the semiconductor module and connected in an anti-parallel configuration with the corresponding power transistor die 302, 334 e.g. in the case of IGBT dies requiring reverse blocking capability and the freewheeling diodes 340, 342 are not co-packaged with the power transistor dies.

Figure 14:
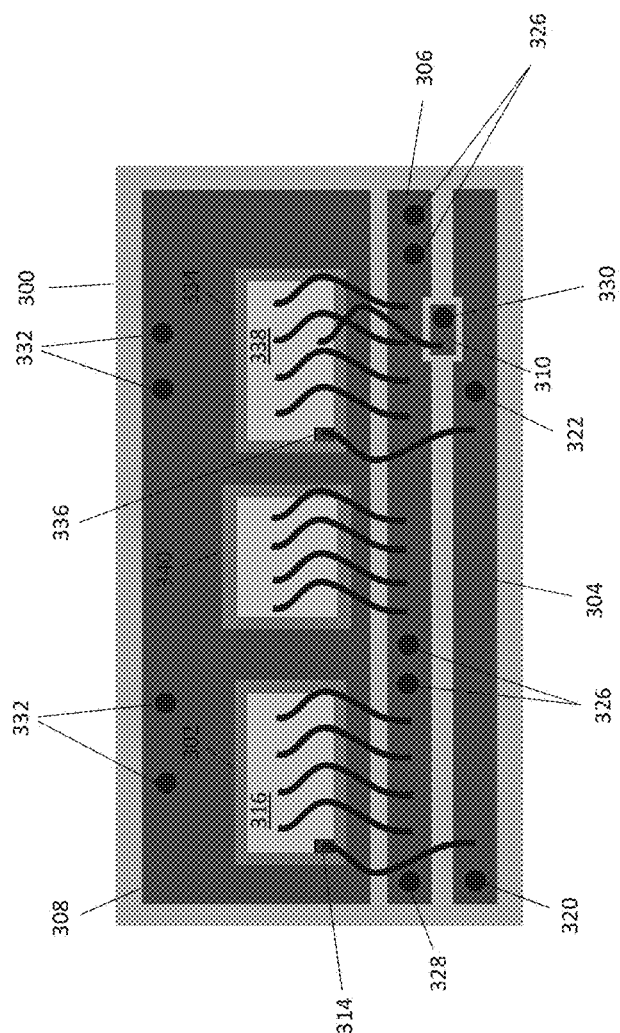

FIG. 14 illustrates an eight embodiment of a semiconductor module that includes a substrate 300 and a power semiconductor die 302 attached to the substrate 300. The semiconductor module embodiment shown in FIG. 14 is similar to the embodiment shown in FIG. 13. Different, however, the discrete freewheeling diodes 340, 342 are placed between neighboring ones of the power transistor dies 302, 334.

Figure 15:
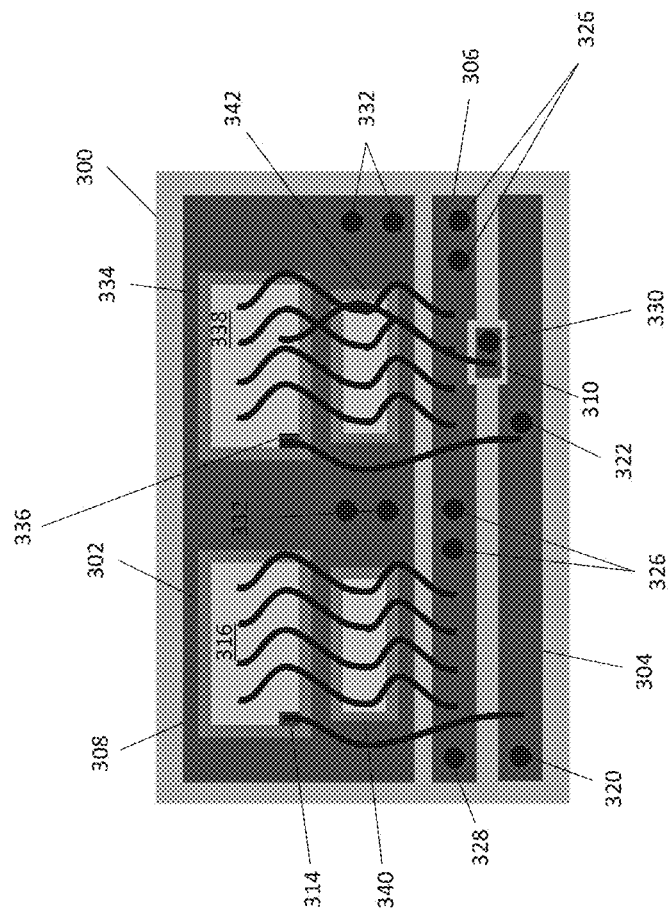

FIG. 15 illustrates a ninth embodiment of a semiconductor module that includes a substrate 300 and a power semiconductor die 302 attached to the substrate 300. The semiconductor module embodiment shown in FIG. 15 is similar to the embodiment shown in FIGS. 13 and 14. Different, however, the discrete freewheeling diodes 340, 342 are placed in front of the power transistor dies 302, 334.

Figure 16:
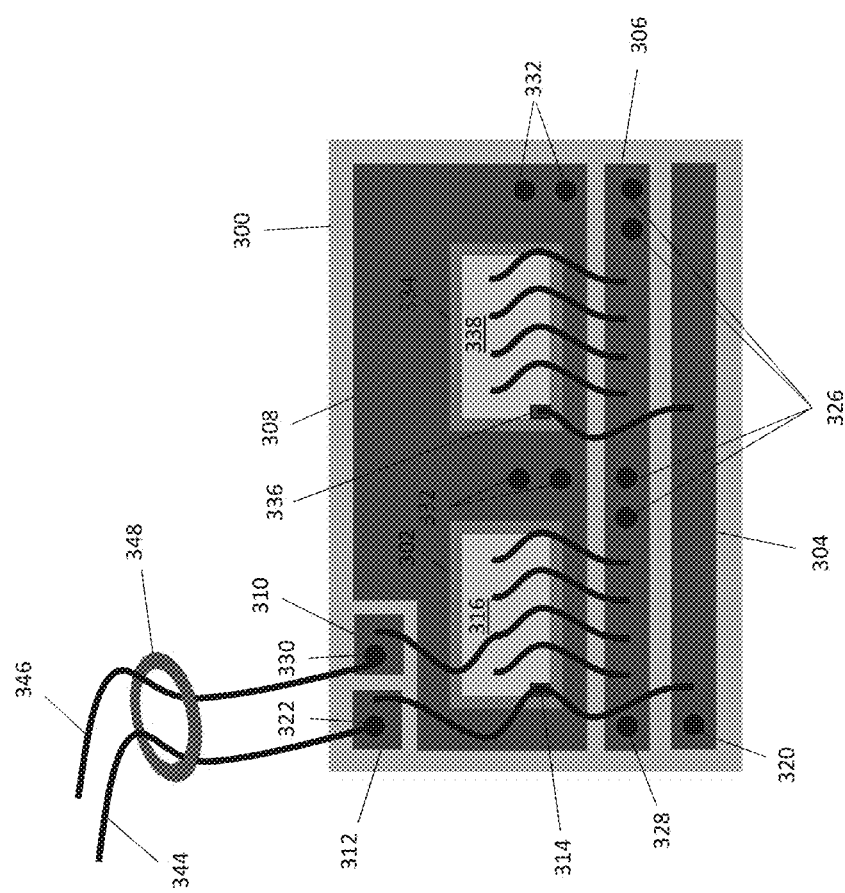

FIG. 16 illustrates a tenth embodiment of a semiconductor module that includes a substrate 300 and a power semiconductor die 302 attached to the substrate 300. The semiconductor module embodiment shown in FIG. 16 is similar to the embodiment shown in FIG. 11. Different, a first sense wire 344 is attached to the gate sense terminal 322 of the semiconductor module and a second sense wire 346 is attached to the emitter/source sense terminal 330 of the module. Also, a common mode choke 348 such as a magnetic core is applied to the first and the second sense wires 344, 346. The sense wires 344, 346 can be realized by e.g. a twisted pair of wires, coax cable, striplines or a parallel plate flexible board. In each case, the common mode choke 348 provides common mode rejection to mitigate noise and/or common mode voltage drop.

Figure 17:
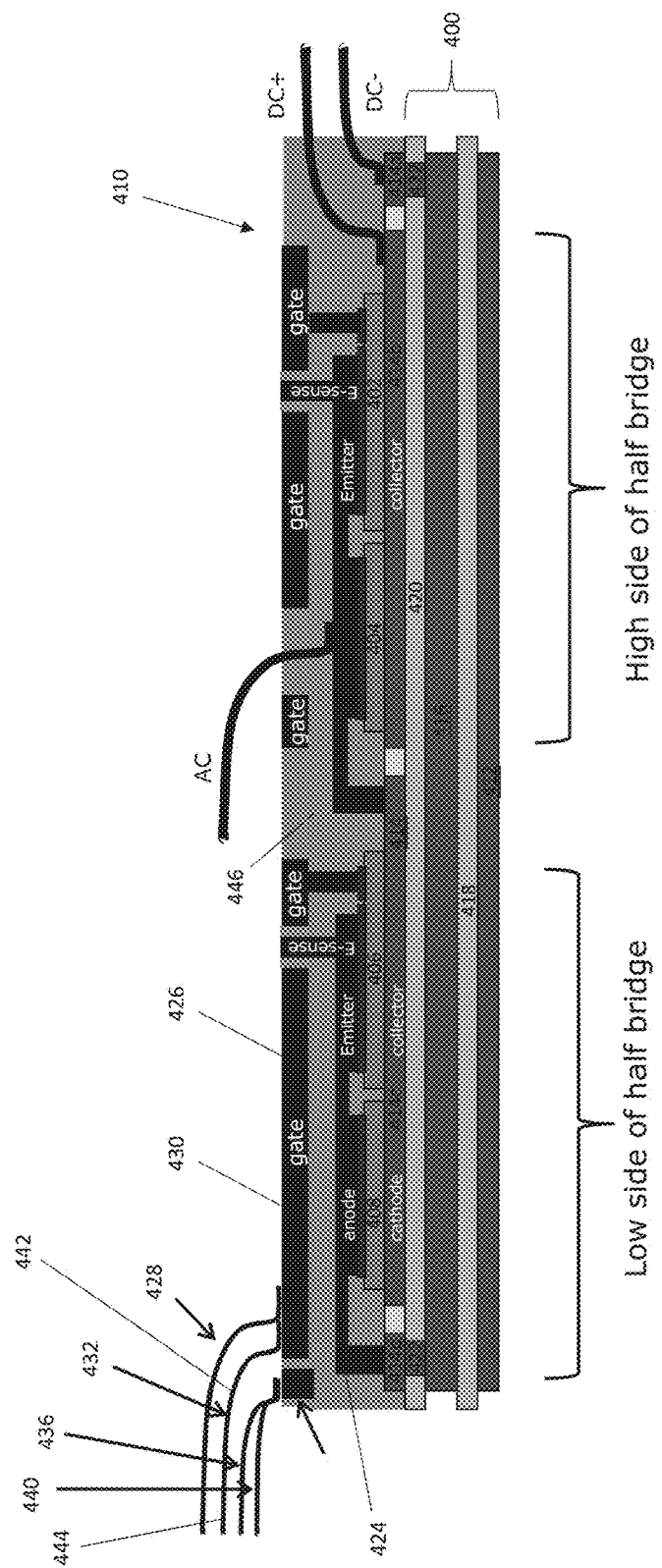
Figure 18:
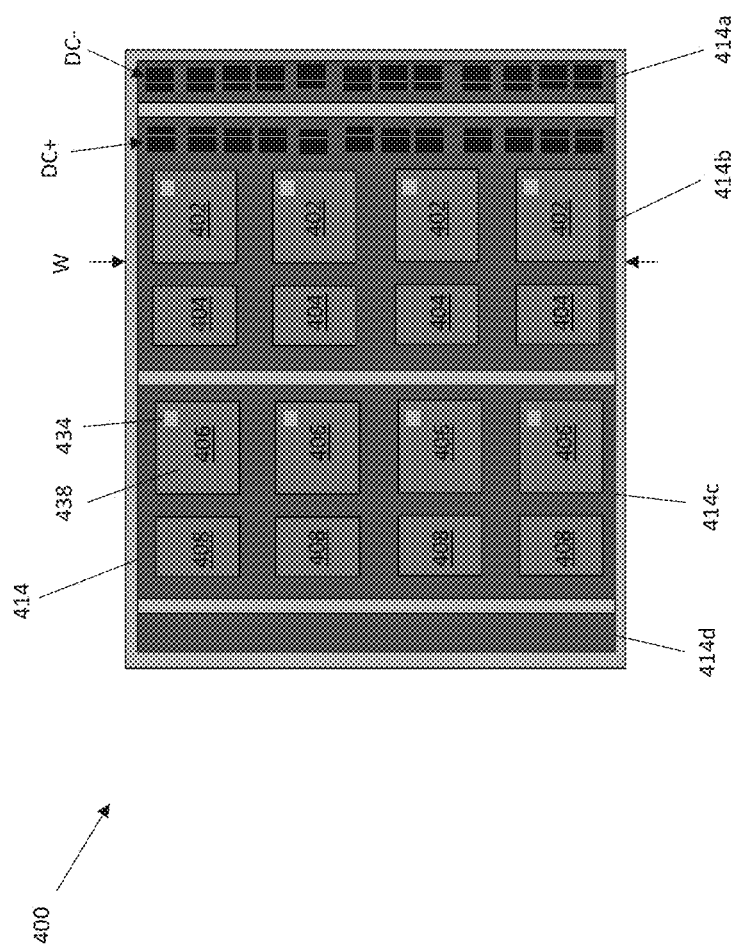
FIG. 18 illustrates a top down plan view of a substrate included in the semiconductor module of FIG. 17.

FIG. 17 illustrates a sectional view of an eleventh embodiment of a semiconductor module. The semiconductor module includes a substrate 400, a plurality of power semiconductor dies 402-408 attached to the substrate 400 and a connection structure 410 disposed over the substrate 400 and the semiconductor dies 402-408. FIG. 18 illustrates a top down plan view of the substrate 400 with the power semiconductor dies 402-408 attached to the substrate 400, and without the connection structure 410.

The substrate 400 includes a lowermost metal layer 412, an uppermost metal layer 414 and an intermediary metal layer 416. The intermediary metal layer 416 is separated from the lowermost metal layer 412 by a first insulating layer 418, and separated from the uppermost metal layer 414 by a second insulating layer 420. The uppermost metal layer 414 is patterned into a plurality of strips 414a-414d which extend in parallel over a width (W) of the substrate 400.

A first group (high-side) of power transistor dies 402, a first group (high-side) of diode dies 404, a second (low-side) group of power transistor dies 406 and a second group (low-side) of diode dies 408 are attached to the substrate 400 in respective rows over the width of the substrate 400. Each diode 404/408 is connected in an anti-parallel configuration with the corresponding power transistor die 402/406 in the same group of transistor dies. The high-side power transistor dies 402 are electrically connected in parallel. Likewise, the low-side power transistor dies 406 are electrically connected in parallel. The high-side power transistor dies 402 are connected to the low-side power transistor dies 406 in a half-bridge or full-bridge configuration.

To ensure current sharing of paralleled power semiconductor devices, each group of semiconductor dies 402-408 is attached to one strip 414x of the uppermost metal layer 414 of the substrate 400 and evenly distributed over the width of that strip as illustrated in FIG. 18. As such, the semiconductor dies 402-408 in each group are placed side-by-side in a single row and the rows of dies are attached to parallel ones of the metal strips 414a-414d. The direction of each row of dies is oriented perpendicular to the current flowing within the parallel plates 414a-414d. A parallel plate waveguide structure is formed by the upper metal layer 414 and the intermediary metal layer 416 of the substrate 400. Current enters the uppermost metal layer 414 via a DC+ terminal of the semiconductor module which is attached to one of the strips 414b of the uppermost metal layer 414. Current exits through the intermediary metal layer 416 via a DC− terminal attached to a different strip 414a of the uppermost metal layer 414. The DC+ and DC− terminals are evenly distributed over the width of the corresponding metal strips 414a, 414b to ensure the current is spread relatively evenly across the width of the substrate 400.

The DC− terminal is electrically connected to the intermediary metal layer 416 of the substrate 400 through a plurality of conductive vias 422 that extend through the upper insulating layer 420. The conductive vias 422 are insulated from the uppermost metal layer 414. The intermediary metal layer 416 of the substrate 400 shields oscillations on the AC terminal, and brings the DC− potential from the low-side to the high-side. The connection structure 410, which is disposed over the substrate 400 and the power semiconductor dies 402-408, provides the remaining connections to the semiconductor dies 402-408.

The connection structure 410 can be implemented by embedding technology or flexboard technology. The lowermost metal layer 424 of the connection structure 410 provides emitter(source)/anode interconnects to both groups (high-side and low-side) of power semiconductor dies 402-408. The uppermost metal layer 426 of the connection structure 410 provides the main gate and auxiliary emitter connections, and the gate sense and emitter/source sense connections, to both groups (high-side and low-side) of power transistor dies 402, 406. The uppermost metal layer 426 of the connection structure 410 can have a layout which brings all main gate, gate sense, auxiliary/source, main emitter/source and emitter/source sense connections to the opposite edge of the connection structure 410 as the DC+/− terminals. Terminals for main gate, gate sense, auxiliary/source, main emitter/source and emitter/source sense connections of the high-side and low-side devices 402-408 can be arranged behind each other on this same side of the connection structure 410. Only low-side terminal connections are shown in FIG. 17 for ease of illustration.

More particularly, one or more low-side main gate terminals 428 are attached to a first conductor section 430 of the connection structure 410. A low-side gate sense terminal 432, which is electrically connected to the gate pad or an additional gate pad 434 of at least one of the low-side power transistor dies 406, can be attached to the same conductor section 430 as the low-side main gate terminal 428 as shown in FIG. 17, or to a different conductor section of the connection structure 410. A low-side emitter/source sense terminal 436, which is electrically connected to the emitter/source pad 438 of at least one of the low-side power transistor dies 406, can be attached to the same conductor section as a low-side auxiliary emitter/source terminal 440 as shown in FIG. 17, or to a different conductor section. The low-side gate sense terminal 432 and the low-side emitter/source sense terminal 436 are configured to carry just a current which is necessary to sense a gate-to-emitter/source voltage of at least one of the low-side power transistor dies 406. In other words, the low-side gate sense terminal 432 and the low-side emitter/source sense terminal 436 of the semiconductor module do not carry current for charging or discharging the gate capacitance of the low-side power transistors 406. Instead, the low-side gate sense terminal 432 and the low-side emitter/source sense terminal 436 of the semiconductor module carry only a negligible amount of current which is needed to measure the gate-to-emitter/source voltage of the low-side power transistors 406.

A first sense wire 442 can be attached to the low-side gate sense terminal 432, a second sense wire 444 can be attached to the low-side emitter/source sense terminal 436, and a common mode choke (not shown in FIG. 17) can be applied to the first and the second sense wires 442, 444 e.g. as shown in FIG. 16. The connection structure 410 can provide a similar terminal arrangement for the high-side power transistor dies 402.

The uppermost metal layer 426 of the connection structure 410 can be integrated into the lower metal layer 424 by related structuring of the layout, so that flexboard or embedding embodiments require only one insulating layer 446 and one conductive layer for carrying the signals and DC+/− into and out of the power semiconductor dies 402-408. In the case of flexboard technology, the terminals 428, 432, 436, 440 can be part of the flexboard and reach over the substrate 400. A heatsink can be attached to the lowermost metal layer 412 of the substrate 400 or a baseplate on which the module is assembled.

The substrate 400 to which the power semiconductor dies 402-408 are attached can be any standard substrate having a plurality of metal layers separated by insulating layers. For example, the substrate 400 can be a laminate, a ceramic-based substrate such as a DCB (direct copper bonded) substrate, AMB (active metal brazed) substrate, or DAB (direct aluminum bonded) substrate with metallized surfaces, a printed circuit board (PCB), a substrate produced by a chip embedding technology such as eWLB (embedded wafer level ball grid array), etc.

The semiconductor module embodiment illustrated in FIGS. 17 and 18 utilizes semiconductor dies having an active backside i.e. vertical devices in which current flows between the front side facing away from the substrate to the backside attached to the substrate. In other embodiments, the power semiconductor dies 402-408 can have an insulated or isolated backside.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a single controllable power semiconductor die embedded in a molding compound, the power semiconductor die comprising a gate pad, an emitter/source pad and a collector/drain pad;
   a first terminal protruding from the molding compound and electrically connected to the gate pad of the power semiconductor die;
   a second terminal protruding from the molding compound and electrically connected to an additional gate pad of the power semiconductor die;
   a third terminal protruding from the molding compound and electrically connected to the collector/drain pad of the power semiconductor die;
   a fourth terminal protruding from the molding compound and electrically connected to the emitter/source pad of the power semiconductor die; and
   a fifth terminal protruding from the molding compound and electrically connected to the emitter/source pad of the power semiconductor die,
   wherein the second terminal and the fourth terminal are configured to carry just a current which is necessary to sense a gate-to-emitter/source voltage of the power semiconductor die,
   wherein the power semiconductor die comprises an integrated gate resistor in series with a gate of a power transistor,
   wherein the additional gate pad is electrically connected to a node between the gate of the power transistor and the integrated gate resistor.

2. The semiconductor package of claim 1, wherein the single controllable power semiconductor die is an IGBT, MOSFET or HEMT die.

3. The semiconductor package of claim 1, wherein the molding compound is an elastomer, a composite compound, a thermoplastic, a thermoset plastic or a thermosetting plastic.

4. The semiconductor package of claim 1, wherein the single controllable power semiconductor die is a vertical transistor device.

5. The semiconductor package of claim 1, wherein the single controllable power semiconductor die is a lateral transistor device.

* * * * *